United States Patent [19]

Engelhardt

[11] Patent Number: 5,118,383

[45] Date of Patent: Jun. 2, 1992

[54] METHOD FOR PRODUCING TRENCH STRUCTURES IN SILICON SUBSTRATES FOR VLSI SEMICONDUCTOR CIRCUITS

[75] Inventor: Manfred Engelhardt, Feldkirchen-Westerham, Fed. Rep. of Germany

[73] Assignee: Siemens Aktiengesellschaft, Munich, Fed. Rep. of Germany

[21] Appl. No.: 636,203

[22] Filed: Dec. 31, 1990

[30] Foreign Application Priority Data

Feb. 1, 1990 [DE] Fed. Rep. of Germany ....... 4002980

[51] Int. Cl.$^5$ ........................................... H01L 21/76
[52] U.S. Cl. .................................. 156/643; 156/647; 156/662; 437/52; 437/67
[58] Field of Search ............... 156/643, 644, 647, 662; 437/65, 228, 919, 52, 67

[56] References Cited

U.S. PATENT DOCUMENTS

| | | | |
|---|---|---|---|
| 4,383,885 | 3/1983 | Majdan et al. | 156/643 |
| 4,496,448 | 1/1985 | Tai et al. | 204/192 E |
| 4,502,914 | 3/1985 | Trumpp et al. | 156/643 |
| 4,690,729 | 9/1987 | Douglas | 156/643 |
| 4,702,795 | 10/1987 | Douglas | 156/643 |
| 4,717,448 | 1/1988 | Cox et al. | 156/643 |
| 4,772,569 | 9/1988 | Ishii et al. | 437/67 |

FOREIGN PATENT DOCUMENTS

| | | |
|---|---|---|
| 0203560 | 12/1986 | European Pat. Off. |
| 0338207 | 10/1989 | European Pat. Off. |
| 3613181 | 10/1987 | Fed. Rep. of Germany |
| 3829015 | 4/1989 | Fed. Rep. of Germany |

OTHER PUBLICATIONS

Thomas, D., et al, "An Investigation of the Reactive Ion Etching or Polysilicon in pure $Cl_2$ plasmas... Spectrometry" J Vac. Sci. Technol. B8(5) Sep./Oct. 1990 pp. 1044–1051.

Mucha, J., "The Gases or Plasma Etching Silicon Based Technology", Solid State Technol., 3185 pp. 123–127.

Engelhardt, M., Evaluation of Single Crystal Silicon Dry Etch Processes with Thermal Wave Experiments, Proceedings of the 9th International Symposium on Plasma Chemistry, 1989, pp. 978–983.

Englehardt, M. A New $CBrF_3$ Process for Etching Tapered Trenches in Silicon, Journal of Electrochemical Society, Aug. 1987, pp. 1985–1988.

Bogle-Rohwer, E., Wall Profile Control in a Triiode Etcher, Solid-State Technology, Apr. 1985, pp. 251–255.

Sato, M., et al. Etched Shape Control of Single-Crystal Silicon in Reactive Ion Etching Using Cholorine, Solid-State Science and Technology, Nov. 1987, pp. 2856–2862.

*Primary Examiner*—Olik Chaudhuri
*Assistant Examiner*—G. Fourson
*Attorney, Agent, or Firm*—Hill, Van Santen, Steadman & Simpson

[57] ABSTRACT

A method is provided for producing trench structures having vertical, smooth side walls and straight, flat trench floors in silicon substrates. The reactive ion etching is implemented in a triode single-wafer plate reactor upon use of an etching mask preferably composed of $SiO_2$, and with an etching gas atmosphere exclusively composed of chlorine, being implemented at a low-pressure. Compared to known ion etching processes, the method provides acceptable etching rates with a carbon-free, simple etching chemistry. The method is particularly useful for producing DRAMs with cell concepts of more than 4 Mbits.

4 Claims, 1 Drawing Sheet

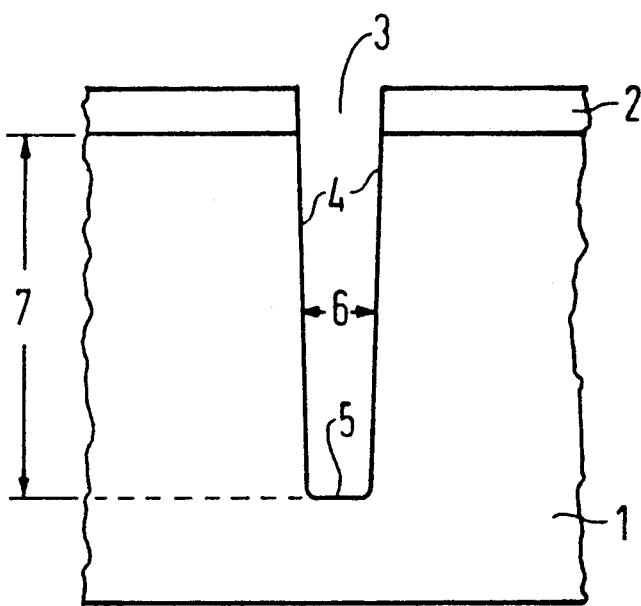

METHOD FOR PRODUCING TRENCH STRUCTURES IN SILICON SUBSTRATES FOR VLSI SEMICONDUCTOR CIRCUITS

BACKGROUND OF THE INVENTION

The present invention relates to a method for producing trench structures in silicon substrates for VSLI semiconductor circuits by reactive ion etching using an etching mask in a triode single-wafer plate reactor. The present invention also relates to the use of this method for producing trench structures.

European patent Application 0 338 207 discloses a method for etching trench structures in silicon substrates for semiconductor circuits. An atmosphere containing trifluorobromethane and nitrogen is used as an etching agent. A single-wafer plate reactor is provided that comprises a triode arrangement, whereby two different high-frequencies are beamed in. Such an arrangement is disclosed in European Patent Application 0 203 560.

In order to create integrated semiconductor memory circuits (DRAMs) having cell concepts beyond 4Mbit (16M, 64M), trench structures are required that, given a cross-sectional area of 1 $\mu m^2$ and a depth of at least 4 through 5 $\mu m$, have profiles with vertical (through slightly slanting), smooth side walls and straight, flat trench floors (see the FIGURE) for the capacitors of the circuit. Attacks of the etching agent at the edges of the structure should be at a minimum, i.e., without "trenching." Microloading effects cannot be tolerated. In order to be able to achieve high electrical yields without having to implement additional after-treatment steps, damage to the substrate material must be as minimal as possible.

SUMMARY OF THE INVENTION

The present invention satisfies the requirements set forth above in an optimally simple etching process that is carried out without by-products. To this end, a method is provided for producing trench structures in silicon substrates for VSLI semiconductor circuits by reactive ion etching using an etching mask in a triode single-wafer plate reactor. The method comprises the steps of: producing a structured layer composed of a silicon compound on a silicon substrate as an etching mask; using only chlorine as an etching gas; and implementing the etching process at a low pressure.

In an embodiment of the method, $SiO_2$ that is generated from the vapor phase (CVD) is used as the material for the etching mask.

In an embodiment of the method, the pressure in the reactor is set at a range of from approximately 0.1 to about 1 Pa.

In an embodiment of the method, the chlorine gas flow in the reactor is set at a range of from 5 to about 30 sccm.

In an embodiment, the method is used to produce trench cells for semiconductor memories having three-dimensional structures.

In an embodiment, the method is used for producing trench insulations of LSI CMOS or bipolar circuits that separate the active transistor regions in the silicon substrate.

Additional features and advantages of the present invention are described in, and will be apparent from, the detailed description of the presently preferred embodiments and from the drawings.

BRIEF DESCRIPTION OF THE DRAWING

The FIGURE illustrates a cross-sectional view of a structure including a trench.

DETAILED DESCRIPTION OF THE PRESENTLY PREFERRED EMBODIMENT

A method is provided by the present invention for producing trench structures having vertical smooth side walls and straight, flat trench floors in silicon substrates. The method is used to produce trench structures in silicon substrates for VSLI semiconductor circuits by reactive ion etching upon use of an etching mask in a triode single-wafer plate reactor. The method comprises the steps of:
a) producing a structured layer composed of a silicon compound on the silicon substrate as etching mask;
b) using only chlorine as an etching gas; and
c) implementing the etching process at a low-pressure range.

Pursuant to the present invention contamination can be controlled to an extremely low degree due to the ability to control the process at a low gas pressure. Compared to known etching agents such as trifluorobromethane, a carbon-free chemical process is used due to the employment of $CVD-SiO_2$ as an etching mask ("hard mask") and chlorine as the process gas. As a result of the process the contamination is further reduced. Additionally, no polymers arise. The side wall passivation can be kept to a minimum thickness.

Furthermore, substrate damage is minimal. After a brief dip in hydrofluoric acid, to remove the etching mask, it was found in an evaluation with the thermowave method (see Proc. 9th Int. Symp. on Plasma Chemistry (ISPC), pages 978 through 983 (1989)) that specimens manufactured using the method of the present invention and having trenches that were 4 $\mu m$ deep were comparable to untreated substrates with respect to their substrate quality.

By way of example, a reactor of the type "MCR 2000" available from the Tegal Company, as disclosed in European Patent Application 0 203 560, was used for implementation of the method of the present invention. The reactor of this triode system is characterized by: the simultaneous employment of two different high-frequencies that allow extensive independence of the adjustability from density and kinetic energy of the reactive species; and the employment of permanent magnets at the wall and at the cover of the reactor. This reduces the loss of electrically charged particles to the reactor wall due to the magnetic enclosure and thereby leads to an effective ionization (even at low gas pressure).

By way of example, and not limitation, the following process parameters were set in order to achieve the structure shown in cross-section in the FIGURE:

| | |
|---|---|
| Chlorine gas flow | 20 sccm |
| Gas pressure in the reactor | 0.26 Pa |
| RF-frequency power for 100 kHz | 50 W |
| RF-frequency power for 13.56 MHz | 1000 W |

Utilizing the above process parameters, trenches 3 that have a mean trench width 6 of approximately 0.75 $\mu m$ and a trench depth 7 of 4.5 $\mu m$ were obtained in a silicon substrate 1 having a $SiO_2$ layer 2 situated thereon. An etching time of 6 minutes was used. Optimum trench profiles are thereby obtained by the present invention. In this regard, the resultant trench walls 4 were vertical and smooth and the trench floor 5 was straight and flat. Despite the low pressure, the etching rate amounts to 0.5 μm/min. The selectivity to the $SiO_2$ mask layer (2) is greater than 10:1. The etching rate inhomogeneities, using silicon, were below ±5 percent and were below ±10 percent using $SiO_2$.

It was found that the thickness of the side wall passivation layer is minimal, typically 3 nm.

The method of the present invention can be used to manufacture DRAMs having cell concepts beyond 4Mbit as exist, for example, in the IVEC cell concept (producing "silicon columns") or in what is referred to as stacked capacitor in the trench (producing trenches, shown in the FIGURE). Additionally, the method of the present invention can also be used for the manufacture of SRAMs, bipolar and logic circuits, wherein either deep insulating trenches (for separating the buried layer in bipolar circuits) are required or wherein shallow insulating trenches (approximately 0.5 μm deep) are to be produced in order to be able to replace the known LOCOS insulating technical with the BOX insulating technique. Particularly given these shallow insulating trenches, the same etching depth is required in regions wherein silicon lies locally exposed in large areas and in small openings of the mask.

It should be understood that various changes and modifications to the presently preferred embodiments described herein will be apparent to those skilled in the art. Such changes and modifications can be made without departing from the spirit and scope of the present invention and without diminishing its attendant advantages. It is therefore intended that such changes and modifications be covered by the appended claims.

I claim as my invention:

1. A method for producing trench structures in silicon substrates for VLSI semiconductor circuits by reactive ion etching using an etching mask in a triode single-wafer plate reactor, comprising the steps of:
   producing a structured layer composed of a silicon compound on a silicon substrate as an etching mask;
   employing only chlorine as an etching gas;
   implementing the etching process at low-pressure, wherein the pressure in the reactor is set at a range of from approximately 0.1 to about 1 Pa;
   simultaneously applying two different high-frequency powers to the triode reactor, wherein each of said high-frequency powers is set independently; and
   providing permanent magnets at both a wall and a cover of the reactor.

2. The method of claim 1, wherein $SiO_2$ generated in a CVD process is used as a material for the etching mask.

3. The method of claim 1, wherein the chlorine gas flow in the reactor is set at a range of from approximately 5 to about 30 sccm.

4. The method of claim 1, wherein the pressure in the reactor is between approximately 0.1 and 0.53 Pa.

* * * * *